United States Patent
Wang et al.

(10) Patent No.: US 7,476,291 B2
(45) Date of Patent: Jan. 13, 2009

(54) HIGH CHAMBER TEMPERATURE PROCESS AND CHAMBER DESIGN FOR PHOTO-RESIST STRIPPING AND POST-METAL ETCH PASSIVATION

(75) Inventors: Ing-Yann Albert Wang, Moraga, CA (US); Robert Chebi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 98 days.

(21) Appl. No.: 11/528,275

(22) Filed: Sep. 28, 2006

(65) Prior Publication Data

US 2008/0078744 A1    Apr. 3, 2008

(51) Int. Cl.
*C23F 1/00* (2006.01)
*H01L 21/306* (2006.01)
*H01L 21/302* (2006.01)
*B44C 1/22* (2006.01)
*C03C 15/00* (2006.01)
*C03C 25/68* (2006.01)

(52) U.S. Cl. .................... 156/345.33; 156/345.35; 156/345.34; 438/689; 216/67

(58) Field of Classification Search ............. 156/345.33
See application file for complete search history.

(56) References Cited

U.S. PATENT DOCUMENTS

| | | | |
|---|---|---|---|
| 5,643,394 A | 7/1997 | Maydan et al. | |
| 6,453,992 B1 * | 9/2002 | Kim | 165/206 |
| 6,565,661 B1 * | 5/2003 | Nguyen | 118/715 |
| 6,782,843 B2 | 8/2004 | Kinnard et al. | |
| 2002/0011215 A1 * | 1/2002 | Tei et al. | 118/723 MW |
| 2005/0183827 A1 * | 8/2005 | White et al. | 156/345.34 |
| 2006/0219361 A1 | 10/2006 | Wang et al. | |

OTHER PUBLICATIONS

International Search Report and Written Opinion dated Jan. 24, 2008 for PCT/US07/19886.

* cited by examiner

*Primary Examiner*—Michael Cleveland
*Assistant Examiner*—Keath Chen
(74) *Attorney, Agent, or Firm*—Buchanan Ingersol & Rooney PC

(57) ABSTRACT

A vacuum chamber for passivation and/or stripping a photoresist layer formed on a semiconductor substrate. The chamber includes an internal chamber body that forms a cavity to surround the substrate and has a plurality of gas passages extending therethrough to the cavity and one or more heaters to heat the internal chamber body. The internal chamber body is slidably mounted on an external chamber body that surrounds a side of the internal chamber with a gap therebetween. The device also includes: an exhaust unit operative to pump the gas from the cavity; a chamber top mounted on the internal chamber body to cover a top surface of the internal chamber body with a gap therebetween and having an opening in fluid communication with the gas passages; and a plasma source operative to energize the gas into a plasma state and coupled to the opening for fluid communication with the cavity.

21 Claims, 7 Drawing Sheets

HIGH CHAMBER TEMPERATURE PROCESS AND CHAMBER DESIGN FOR PHOTO-RESIST STRIPPING AND POST-METAL ETCH PASSIVATION

BACKGROUND

Integrated circuits are formed from a wafer or substrate over which are formed patterned microelectronics layers. In the process of fabricating the integrated circuits, it is common to employ patterned photoresist layers as mask layers for forming those patterned layers from previously deposited blanket layers. After forming one of the patterned layers on the substrate, the corresponding photoresist layer may be removed from the substrate in a stripper chamber or asher before continuing to the next process.

Since photoresist stripping is used frequently in semiconductor manufacturing foundries, strippers or stripper chambers are designed to have very short process times, i.e., high throughput, to reduce the overall substrate manufacturing cost. As such, the performance of a downstream plasma stripper chamber is often determined by its strip rate, which is defined as the rate of photoresist removal per unit time. The strip rate determines how long a substrate is exposed to plasma. As the plasma in the stripper chamber may damage various circuits on the substrate, it is preferred to minimize the substrate's exposure time to ionized gas by increasing the strip rate. Hereinafter, the terms ionized gas and plasma are used interchangeably.

FIG. 1 shows a schematic diagram of a downstream chamber 100 of a stripper chamber. As depicted, a substrate 104 having a photoresist layer to be stripped may be held by a wafer heater chuck 106. Process gas may be energized by a plasma source into plasma 108, enter into the chamber 100 through an opening 110 in the chamber wall 102, and thence passes through the holes in one or more baffles or diffusers 112. The baffles 112 may disperse the gas to improve the gas flow uniformity at the substrate surface. In general, each baffle may contain a large number of holes 122. FIG. 2 shows a top plan view of one of the baffles 112 in FIG. 1. The strip uniformity and the strip rate may be highly dependent upon the baffle configuration. The size and location of the holes 122 in a baffle may be determined to enhance the uniformity of gas flow at the substrate surface. For instance, as depicted in FIG. 2, the sizes of the holes 122 may increase with increasing distance from the center of the baffles 112 because the center of the baffles 112 may receive more gas flow than the edge. In another design to disperse the gas, a showerhead may be used. However, the number and size of holes in the showerhead are such that they typically create a back pressure. The creation of the back pressure may slow down the gas flow above the showerhead and reduce the fluid dynamic efficiency.

The strip rate of the chamber 100 may be adversely affected by several factors. For instance, when the gas or plasma 108 flows through the opening 110, it expands to fill the larger space within the chamber. This expansion may reduce the gas temperature. As the strip rate may increase as the chamber temperature and/or substrate temperature increases, the strip rate may decrease due to the gas expansion. Furthermore, as the gas passes through the baffles 112, it transfers a portion of its heat energy to the baffles 112 and thereby the strip rate is reduced for the same reasons. In addition, recirculation regions 120 may be formed within the chamber. The flow residence time in the recirculation regions 120 may be large enough for a portion of gas radials or ionic species to recombine into neutral species. The recombination process may generate exothermic reaction energy that can be transferred to the chamber wall 102 and baffles 112. Also, the neutral species, which may pass through the holes 122 with the plasma, may not contribute to the removal of the photoresist layer.

Multiple heaters 116 (as shown in FIG. 1) may be installed within the chamber wall 102 to heat up the chamber 100. In general, the heaters of a conventional stripper chamber are used to maintain the chamber temperature at a level to merely prevent wall deposition and, as a consequence, the chamber temperature is kept relatively low. However, if the stripper chamber were to be heated for the purpose of increasing the gas temperature and thereby enhancing the strip rate, it would require an extensive heating and a complicated cooling mechanism installed on the chamber wall and/or thermal insulators 118 to meet the Semiconductor Industry Equipment Safety Requirements, or shortly, SEMI S2. SEMI S2 requires the outside wall temperature be below 60° C. for the safety of human operators. The material for the insulators 118 may be chosen to be clean-room compatible, i.e., it should not shed particles. For example, it would not be acceptable to simply wrap the chamber body with common industrial fiberglass thermal insulation sheets or blankets. Those requirements typically result in choosing more costly insulation material and/or complex cooling mechanism, adding to the overall complexity of chamber design and manufacturing cost. As such, there is a need for a new stripper chamber that can provide high temperature gas to enhance the strip rate and meet the safety requirements in a cost effective manner.

SUMMARY

In one embodiment, a vacuum chamber for delivering gas to a substrate includes an internal chamber body that forms a cavity to surround the substrate and has a plurality of gas passages extending therethrough to the cavity and one or more heaters to heat the internal chamber body. The internal chamber body is slidably mounted on an external chamber body that is configured to surround an outer surface of the internal chamber with a gap therebetween. An exhaust unit pumps the gas from the cavity, a chamber top mounted on the internal chamber body covers a top surface of the internal chamber body with a gap therebetween and has an opening in fluid communication with the gas passages, and a plasma source energizes the gas and is coupled to the opening for fluid communication with the cavity.

In another embodiment, a vacuum chamber for delivering gas to a substrate, includes: an internal chamber body that forms a cavity to surround the substrate and has an opening and one or more heaters to heat the internal chamber body; and a gas distribution component that is slidably mounted on the internal chamber, has a projection that fits into the opening, and includes a plurality of gas passages extending therethrough to the cavity. The internal chamber body is slidably mounted on an external chamber body that is configured to surround an outer surface of the internal chamber with a gap therebetween. An exhaust unit pumps the gas from the cavity, a chamber top is mounted on and secured to the gas distribution component and configured to cover a top surface of the internal chamber body with a gap therebetween and has an opening in fluid communication with the gas passages, and a plasma source energizes the gas and is coupled to the opening of the chamber top for fluid communication with the cavity.

DETAILED DESCRIPTION

A stripper chamber is described for increasing the strip rate of photoresist on a substrate disposed within the chamber. Certain embodiments may include, inter alia, a gas distribution component that has a very small surface area exposed to the gas and includes a plurality of gas passages formed therein, wherein the gas fans out as it passes through the passages. The stripper chamber may also include an internal chamber body that forms a dome-shaped cavity for further fanning out the gas and thereby providing an evenly distributed gas flow over the substrate surface. The "dome shaped" cavity preferably has a width or diameter which decreases in a direction away from the substrate, i.e., the cavity can be conical, hemispherical, concave or other shape.

In a stripping or ashing process using a gas, the gas may have a high flow rate and high pressure, resulting a high gas velocity at the opening of a downstream stripper chamber. In certain applications, the velocity may reach up to 177 m/sec as estimated in pending U.S. patent application Ser. No. 11/096,820, filed on Apr. 1, 2005, which is herein incorporated by reference in its entirety.

Figure 3:
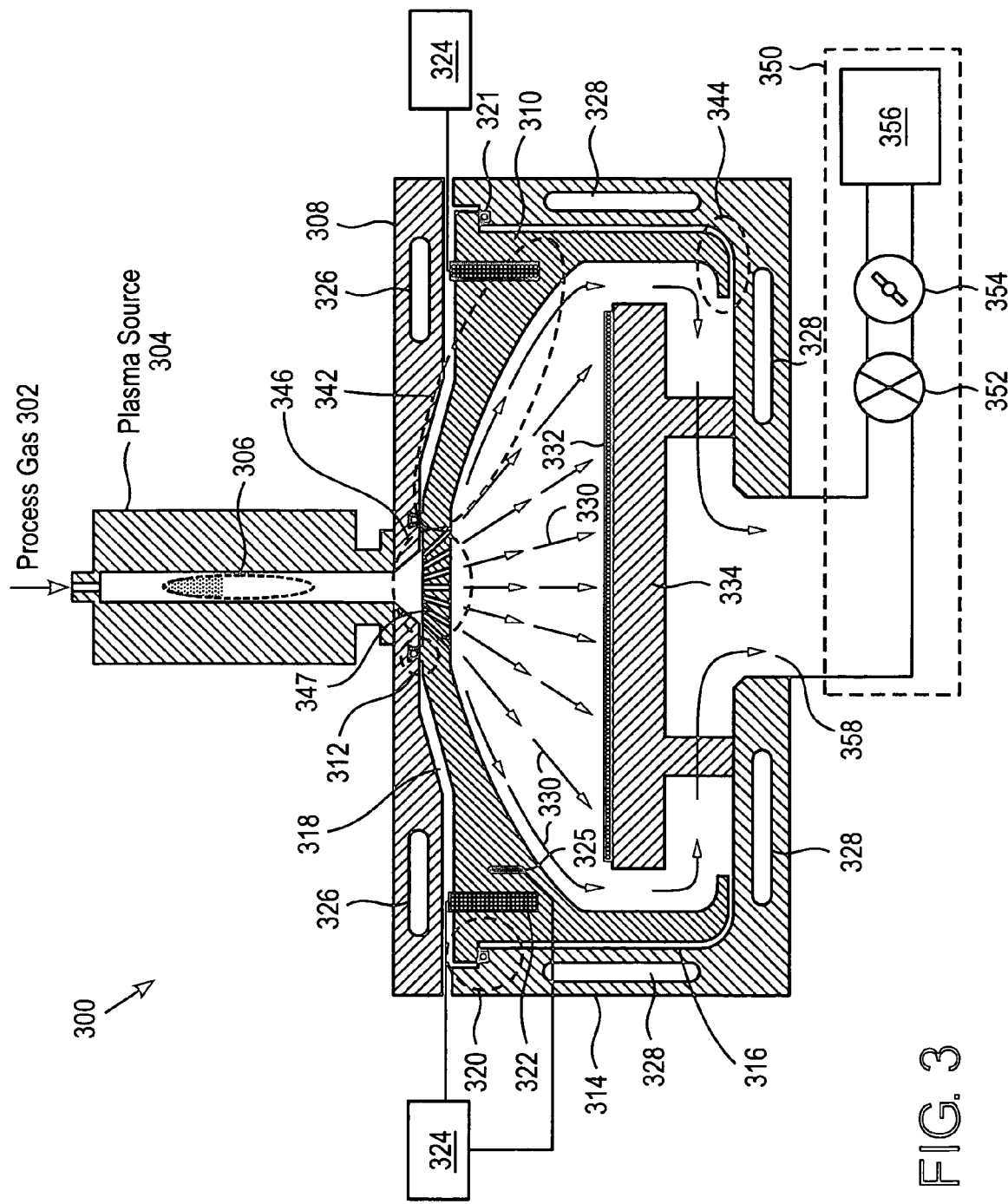
FIG. 3 shows a cross sectional view of an exemplary stripper chamber in accordance with one embodiment.

FIG. 3 shows a cross sectional view of an exemplary stripper chamber shown at 300 and having a gas dispersing mechanism in accordance with one embodiment. As depicted, the stripper chamber may include: a temperature controlled chuck 334 for supporting a substrate 332 thereon; a plasma source 304 for energizing process gas 302 into plasma 306; a temperature controlled chamber top 308 having an opening, the inlet of the opening being aligned with the outlet of the plasma source 304; an internal chamber body 310 that is positioned beneath the chamber top 308, surrounds the substrate 332 and chuck 334, and includes an upper chamber dome shown within area 342 having an inner surface contoured to reduce flow recirculation and turbulence; an external chamber body 314 for mounting the internal chamber body 310 thereon and surrounding the side of the internal chamber body 310; and an exhaust unit 350.

Process gases 302 may include oxygen, nitrogen, chlorine, argon, xenon, $C_xF_y$ ($x \geq 1$, $y \geq 1$) and $C_xF_yH_z$ ($x \geq 1$, $y \geq 1$, $z \geq 1$) depending on the intended process. The plasma source 304 may be microwave or RF-powered and include a gas transport tube, preferably made of sapphire, positioned along the inner wall thereof. As the ionized gas 306 may pass through the opening of the chamber top 308, the gas may transfer heat energy to the chamber top 308. The chamber top 308 may include one or more liquid cooling channels 326 that remove heat energy from the chamber top 308. The flow rate and temperature of the liquid, preferably water, flowing through the channels 326 may be controlled by a feedback control system.

As depicted in FIG. 3, the top central portion of the internal chamber body 310 may include a gas distribution section shown within area 346. The top surface of the gas distribution section 346 may be aligned with the outlet of the opening in the chamber top 308 such that process gas energized by the plasma source 304 can pass directly into the internal chamber body 310. The gas distribution section 346 may include a plurality of gas passages 347, wherein the gas passages 347 may be shaped and oriented such that the gas exiting from the gas passages 347 is dispersed and uniformly fanned out. For example, the gas passages can be angled such that axes of the passages intersect wafer 332 on support 334. The gas dispersed by the gas distribution section 346 may be confined by the curved inner surface of the upper chamber dome 342 to concentrate the process gas in a region adjacent the substrate. The combination of the contoured inner surface of the upper chamber dome 342 and outlet arrangement of the gas passages 347 disperse the gas as indicated by arrows 330 and thereby to generate an evenly distributed gas flow at the substrate surface. The lower portion of the internal chamber body 310 may include a vertical inner wall that surrounds and is spaced outwardly of the periphery of the chuck 334. For processing a circular substrate, the lower portion of the inner chamber 310 preferably comprises a cylindrical wall of uniform thickness. The internal chamber body 310 may also include a curved inner wall section 344 at the bottom thereof to gradually change the flow direction toward the centrally located outlet 358 of the external chamber body 314. FIG. 3 illustrates gas passages 347 having inlets across a first zone and outlets across a second zone larger in area than the first zone. The second zone extends across an area no more than 50% of the area of the exposed surface of substrate 332 to be processed in chamber 100. The gas outlets are oriented such that inner gas outlets direct process gas towards a central region of substrate 332 and outer gas outlets direct process gas toward an outer region of substrate 332.

The chamber top 308, internal chamber body 310, and the external chamber body 314 may be manufactured using plasma-resistant material, wherein the plasma-resistant material can be formed from metallic or non-metallic material. If one or more metals are used to form the parts, they may be made from aluminum, aluminum alloys, stainless steel and high nickel alloy, quartz, aluminum oxide ceramic, aluminum nitride ceramic, and/or yttrium oxide ceramic. Optionally, parts fabricated using metals may be protected against corrosion with plasma resistant coatings. In one example, aluminum may be used as its natural surface oxide provides an excellent corrosion barrier. When using fluorine containing process gases and under certain process conditions, the aluminum native oxide may not provide sufficient protection to avoid formation of aluminum fluoride, which causes contamination on substrates. To prevent aluminum fluorides from forming on aluminum parts, coatings that have superior resistance to fluorine chemistry may be applied to the surface of such parts. Coatings such as anodization over aluminum and its alloys and plasma sprayed aluminum oxide, nickel plating, quartz, yttrium oxide and/or other ceramic materials may be used for protection from various chemistries.

Figure 4:
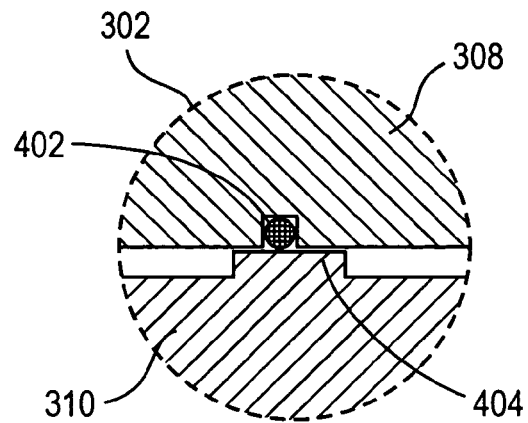
FIGS. 4-5 show enlarged diagrams of two circled areas in FIG. 3.

The internal chamber body 310 may be in contact with the chamber top 308 at a vacuum sealing area. FIG. 4 shows an enlarged view of the circled area 312 (shown in FIG. 3) that includes the vacuum sealing area. As depicted, an O-ring 402 may be disposed between the chamber top 308 and a protruding step or projection 404 formed on the internal chamber body 310, and permit the vacuum to be maintained. Chamber top 308 and chamber bottom 310 are preferably made of metal such as aluminum alloy. The heaters 322 may be rod-shaped cartridge heaters or a band heater. The projection 404 is also in metal-to-metal contact with the bottom surface of the chamber top 308. The internal chamber body 310 and the top 308 may undergo differential thermal expansion. Thus, the projection 404 may slide with respect to the top 308 due to the mismatch in thermal expansion between the internal chamber body 310 and the top 308 as they heat up and cool down. Sliding or rubbing motion occurring in the metal-to-metal contact area may create metal particles into the chamber interior and can be detrimental to the substrate 332. It is preferable to minimize the metal-to-metal contact area to minimize heat transfer from bottom 310 to top 308 during water processing. The projection 404 may be dimensioned to minimize the metal-to-metal contact area while remaining in contact with the O-ring 402 under the sliding motion. The minimized metal-to-metal contact area may also reduce heat transfer from the internal chamber body 310 to the chamber top 308, and thus reduce heat power needed to maintain internal chamber body 310 at a desired temperature range. A gap 318 between the internal chamber body 310 and chamber top 308 aids in reducing heat transfer from the internal chamber body 310 to the chamber top 308.

Figure 5:
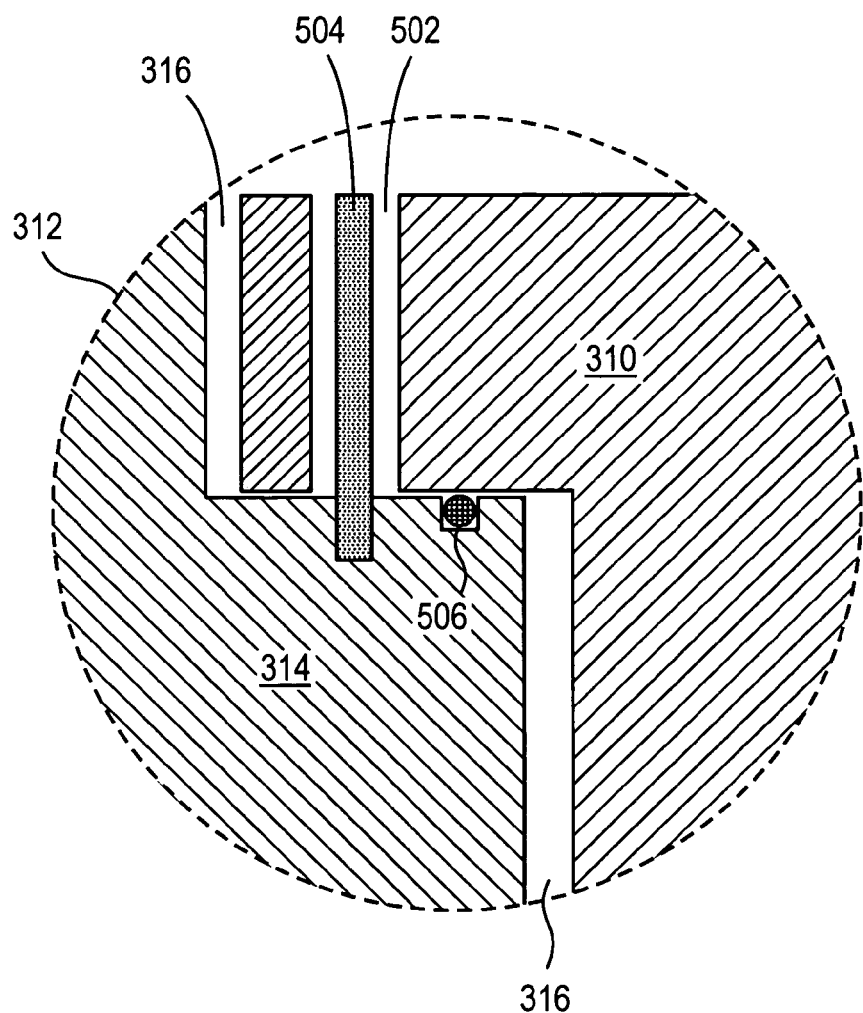

In the preferred embodiment, the internal chamber body 310 includes an outwardly extending annular projection at the top thereof supported in an annular recess in an upper portion of the sidewall of the external chamber body 314. FIG. 5 shows an enlarged diagram of a circled area 320 in FIG. 3, illustrating the metal-to-metal contact area that also functions as a vacuum sealing area. As depicted, an O-ring 506 may be disposed between the internal chamber body 310 and the external chamber body 314, and permit the vacuum to be maintained. The internal chamber body 310 may shield the external chamber body 314 from the process gas and be thermally insulated by a gap 316 therebetween to reduce heat transfer to the external chamber body 314 and thereby to maintain the internal chamber body 310 at high temperature with modest heating by one or more heaters 322. For example, a continuous resistance heater or series of spaced apart resistance heaters can be embedded in the chamber body 310.

The external chamber body 314 may be maintained at a desired temperature by any suitable mechanism, such as by circulating a temperature controlled fluid therethrough, the external chamber body temperature is preferably maintained below about 60° C. The external chamber body 314 may include one or more liquid cooling channels 328 to circulate a liquid for heat removal. A conventional cooling mechanism, such as copper tubing potted into the machined grooves in the external chamber body 314, may be used and, optionally, the temperature and flow rate of the cooling liquid, such as water, in the channels 328 may be controlled by a feedback control system.

The temperature of the internal chamber body 310 may be monitored by one or more temperature sensors 325. The temperature sensor(s) 325 may be, for example, a thermocouple or Resistance Temperature Detector (RTD). The temperature sensor 325(s) may be connected to a controller which operates the power source(s) 324 for the heater(s) 322, wherein the power source(s) 324 may function as a temperature adjustment system, such as feedback (or automatic) temperature control system. As a variation, the power source(s) 324 may permit manual adjustment of the internal chamber body 310 temperature.

As depicted in FIG. 5, the internal chamber body 310 may be positioned in desired alignment with the external chamber body 314 by one or more slots 502 receiving respective pins 504. As shown, the slots 502 are larger than pins 504 to accommodate thermal expansion of the internal chamber 310.

The temperature of the internal chamber body 310 may be much higher than that of the external chamber body 314 during operation. For instance, the operational temperature of the internal chamber body 310 may range from about 20 to 350° C. while the external chamber body temperature may be kept below 60° C.

Figure 6B:
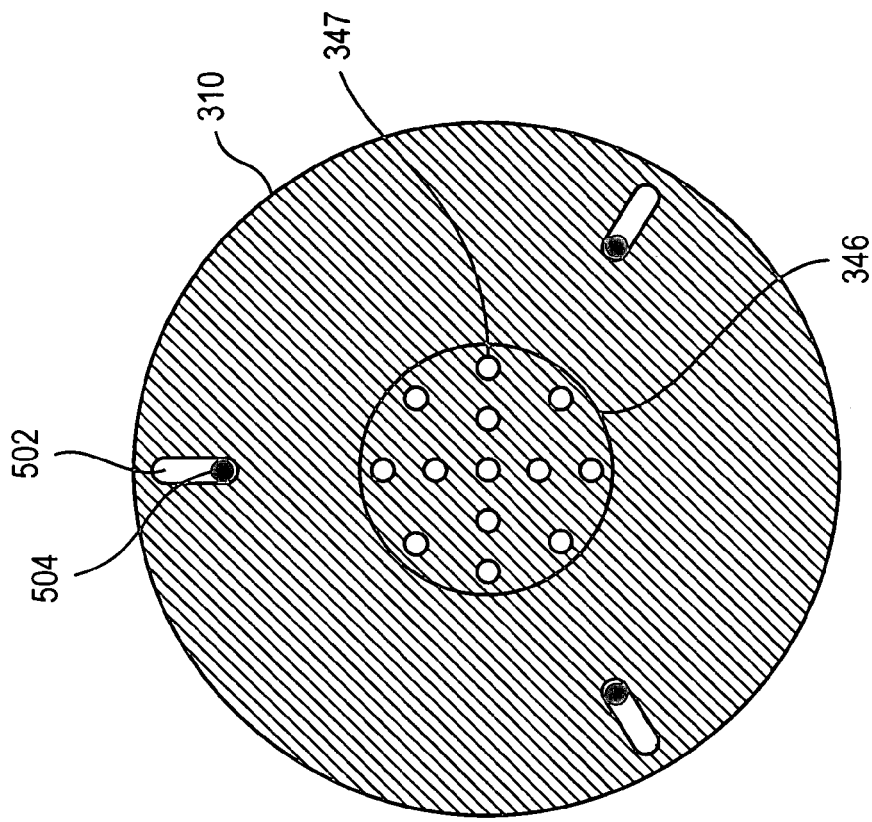
FIG. 6b shows a top plan view of the internal chamber body in FIG. 3 at high temperature.
Figure 6A:
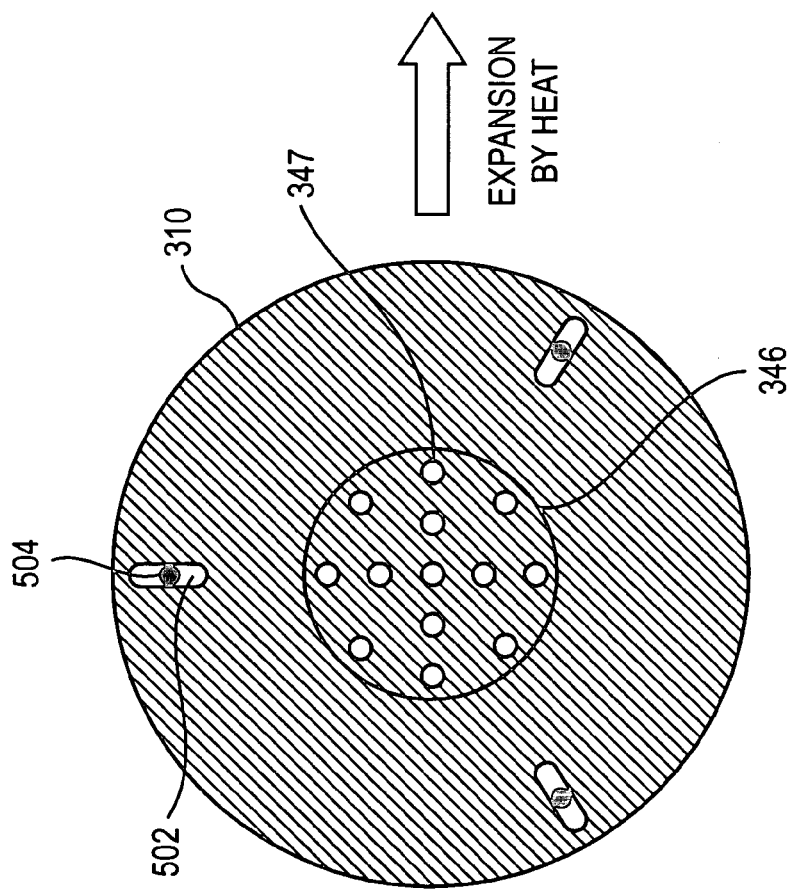
FIG. 6a shows a top plan view of the internal chamber body in FIG. 3 at low temperature.

To allow the internal chamber body to expand freely at high temperature while keeping it centered with respect to external chamber, alignment feature shown in FIG. 6a is used. FIGS. 6a and 6b respectively show top plan views of the internal chamber body 310 at room temperature (low temperature) and high temperature during operation. During installation at room temperature, the internal chamber body 310 may have the same temperature as the external chamber body 314. The internal chamber body 310 may be mounted on the external chamber body 314 and centered by three slots 502 formed in the internal chamber body 310 and the three pins 504 that are secured to the external chamber body 314. During operation, the internal chamber body 310 may experience a larger thermal expansion in its radial direction than the external chamber body 314, causing the pins 504 to respectively slide along the slots 502. The slots 502 and pins 504 may form a float coupling mechanism and prevent damage due to a mismatch in thermal expansion between the internal chamber body 310 and external chamber body 314, i.e., the internal chamber body 310 may be slidably mounted on the external chamber body 314 to allow for unrestricted thermal expansion while keeping the internal chamber body centered. As a variation, the slots may be formed in the external chamber body 314 while the pins may be secured to the internal chamber body 310. Any suitable number of pins and slots may be used in the stripper chamber shown at 300 or other mounting arrangement can be used if desired.

As depicted in FIGS. 3 and 6a-6b, the internal chamber body 310 includes the gas distribution section 346. The gas distribution section 346 may include a plurality of gas passages 347 for fanning out the gas. The gas passages 347 may have uniform or non-uniform cross sections of the same or different sizes and/or axes of the passages may be angled away from the vertical center axis of the internal chamber body 310 so that the gas fans out as it passes through the gas passages 347. Different flow and pressure conditions and gas types may use an internal chamber body with different passage angles and/or size passages to be optimized for best overall performance. As a variation, each passage may be inclined at an angle to minimize or prevent ultraviolet rays generated in a microwave plasma source 304 from reaching the substrate surface. As another variation, each gas passage may be flared at outlet ends thereof to improve the circumferential uniformity of the gas exiting therefrom. The diameter and number of the gas passages 347 may be selected so that they provide uniform gas distribution over the substrate 332 but do not create a large amount of back pressure in the plasma source 304. In FIGS. 6a-6b, only 13 gas passages are shown for purposes of illustration. However, the number, size and the locations of the gas passages 347 can be adjusted to provide a desired distribution of ionized process gas in the chamber 310. More detailed information of gas passages may be found in commonly assigned U.S. patent application Ser. No. 11/096,820, which is herein incorporated by reference in its entirety.

Referring back to FIG. 3, the gas may be drawn through an exit port 358 by an exhaust unit 350. Pumping of the chamber may affect the strip rate of the photoresist on the substrate 332. To provide uniform pumping, the exit port 358 may be centrally located at the bottom of the external chamber body

314. The exhaust unit 350 may include an isolation valve 352 and a throttle valve 354 coupled to a vacuum pump 356.

The stripper chamber shown at 300 may be used to perform a post metal etching process in addition to the strip process. In a post metal etching process, referred to as passivation, the chamber 300 may operate as a corrosion controller of a freshly etched substrate. For example, after plasma etching an aluminum layer on substrate 332 with a chlorine-containing process gas, residual etching gas, such as $Cl_2$, on the substrate 332 may need to be neutralized as quickly as possible so that it does not attack the metallic layer on the substrate 332. Water vapor may be introduced through the plasma source 304 with or without plasma source power so that either water vapor plasma or just water vapor is used for passivation. It has been found that an increase in the internal chamber body temperature may improve the strip rate and the effectiveness of such passivation. For instance, the strip rate can be improved by 20% when the internal chamber body temperature is increased from 150° C. to 300° C. Such temperature increase may reduce the number of defective substrates by more than 50%. While not wishing to be bound by theory, it is believed that the improvement is based on two effects. Firstly, the recombination rate of radicals on the surface of the internal chamber body 310 may be lower at higher surface temperature because gas molecules are less likely to stick to the hot surface. Secondly, the increase in bulk plasma temperature can affect the strip rate and passivation. The hotter plasma may enhance the reaction rate at the surface of material which is either photoresist in the strip process or metal (such as aluminum) in the passivation.

Figure 7:
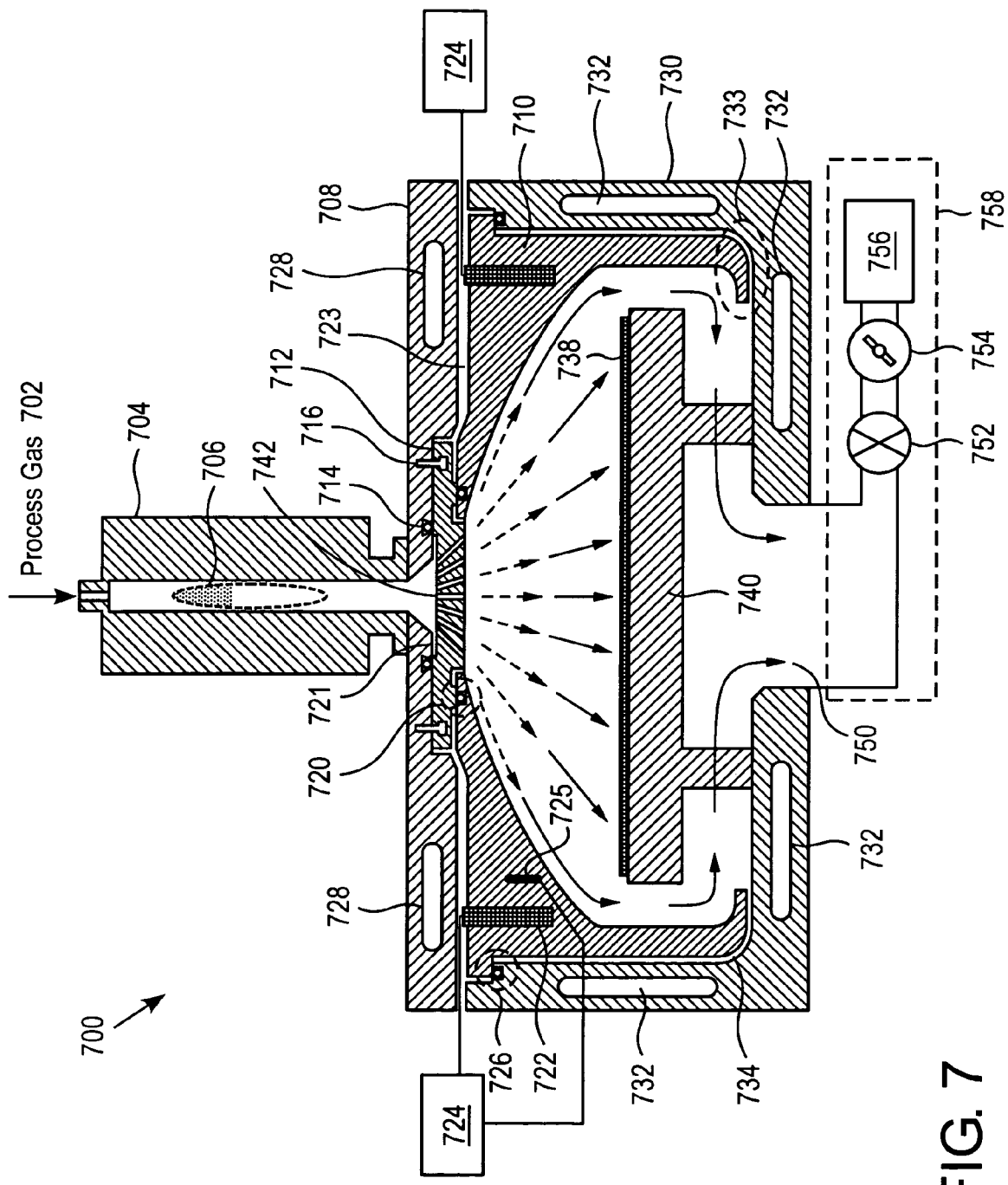
FIG. 7 shows a cross sectional view of an alternative embodiment of the stripper chamber in FIG. 3.

It may be desirable to use high power plasma sources (6 kW for instance) with high process gas flow rates (6 to 8 liter/minute) to achieve high photoresist strip rates. As the gas distribution portion 346 may be located in proximity to the outlet of the plasma source 304, the gas distribution portion 346 may be overheated and likely to be damaged due to erosion earlier than the other portions of the internal chamber body 310. In an embodiment, the gas distribution portion 346 is separated from the rest of the internal chamber body 310 so that the gas distribution portion 346 may be replaced for maintenance. FIG. 7 shows a cross sectional view of an alternative embodiment 700 of the stripper chamber shown at 300 in FIG. 3. As depicted, the stripper chamber shown at 700 includes: a temperature controlled chuck 740 for supporting a substrate 738 thereon; a plasma source 704 that energizes process gas 702 into plasma 706 and is, but not limited to, a microwave or RF-powered source; a chamber top 708 having a central opening, the inlet of the opening being aligned with the outlet of the plasma source 704; a gas injector or gas distribution component 712 secured to the chamber top 708 and having a plurality of gas passages 742 formed therein; an internal chamber body 710 positioned beneath the gas distribution component 712 and including an upper chamber dome that has a streamlined inner surface to reduce flow recirculation and turbulence and including a side portion that surrounds the substrate 738 and support 740 in the circumferential direction of the support 740; and an external chamber body 730 for slidably mounting the internal chamber body 710 thereon and surrounding the side of the internal chamber body 710.

The outlet of the opening in the chamber top 708 is in fluid communication with the inlets of the gas passages 742. The gas passages 742 may be angled away from the centerline of the gas distribution component 712 such that the gas exiting from the gas passages is dispersed and uniformly fanned out. The arrangement, size, and number of the gas passages 742 may be similar to those of the gas passages 347 in FIG. 6a. For instance, the size of gas passages 742 may increase with increasing distance from the center of the gas distribution component 712. However, it will be apparent that the number, size, and locations of the gas passages 742 may be provided in any desired arrangement.

As in the stripper chamber shown at 300 (FIG. 3), the gas distribution component 712, chamber top 708, internal chamber body 710, and the external chamber body 730 may be manufactured using plasma-resistant material, wherein the plasma-resistant material can be formed from metallic or non-metallic material. If one or more metals are used to form the gas distribution component 712, the gas distribution component 712 may be made from aluminum, aluminum alloys, stainless steel and high nickel alloy, quartz, aluminum oxide ceramic, aluminum nitride ceramic, and/or yttrium oxide ceramic. Also, the gas distribution component 712 may have plasma resistant coatings to protect against corrosion, wherein the coating material may be similar to that discussed earlier in the embodiment shown in FIG. 3. The central portion of the gas distribution component 712 may have a substantially flat disk shape. However, the gas distribution component 712 may have other suitable shapes. More detailed description of the gas distribution component 712 may be found in commonly assigned U.S. patent application Ser. No. 11/096,820.

The gas distribution component 712 may be securely attached to the bottom surface of the chamber top 708 by use of suitable fasteners 716, such as screws or bolts. The plasma source 704 may communicate with the internal chamber body 710 through the gas distribution component 712 such that the gas is transported downstream to the internal chamber body 710 through the gas passages 742. A large portion of the top surface of the gas distribution component 712 may be in contact with the chamber top 708 so that the heat energy transferred from the process gas to the gas distribution component 712 can be efficiently conducted to the chamber top 708 and thereby overheating of the gas distribution component 712 can be suppressed. An O-ring 714 may be disposed between the chamber top 708 and the gas distribution component 712 for vacuum sealing. The chamber top 708 may include one or more liquid cooling channels 728, wherein the flow rate and temperature of the cooling liquid, such as water, may be controlled by a feedback control system.

As discussed above, the gas distribution component 712 and the chamber top 708 have a relatively large contact area. Even though they are secured to each other by fasteners 716, a slight mismatch in thermal expansion may occur therebetween and, as a consequence, rubbing may occur between the mating surfaces. As discussed above, rubbing may create metal particles. To avoid rubbing of surfaces inwardly of O-ring 714, a small gap 721 may be introduced between the opposed surfaces inwardly of the vacuum O-ring 714, wherein the O-ring 714 may exclude metal particles which may be generated between contacting surfaces outside the O-ring.

Figure 1:
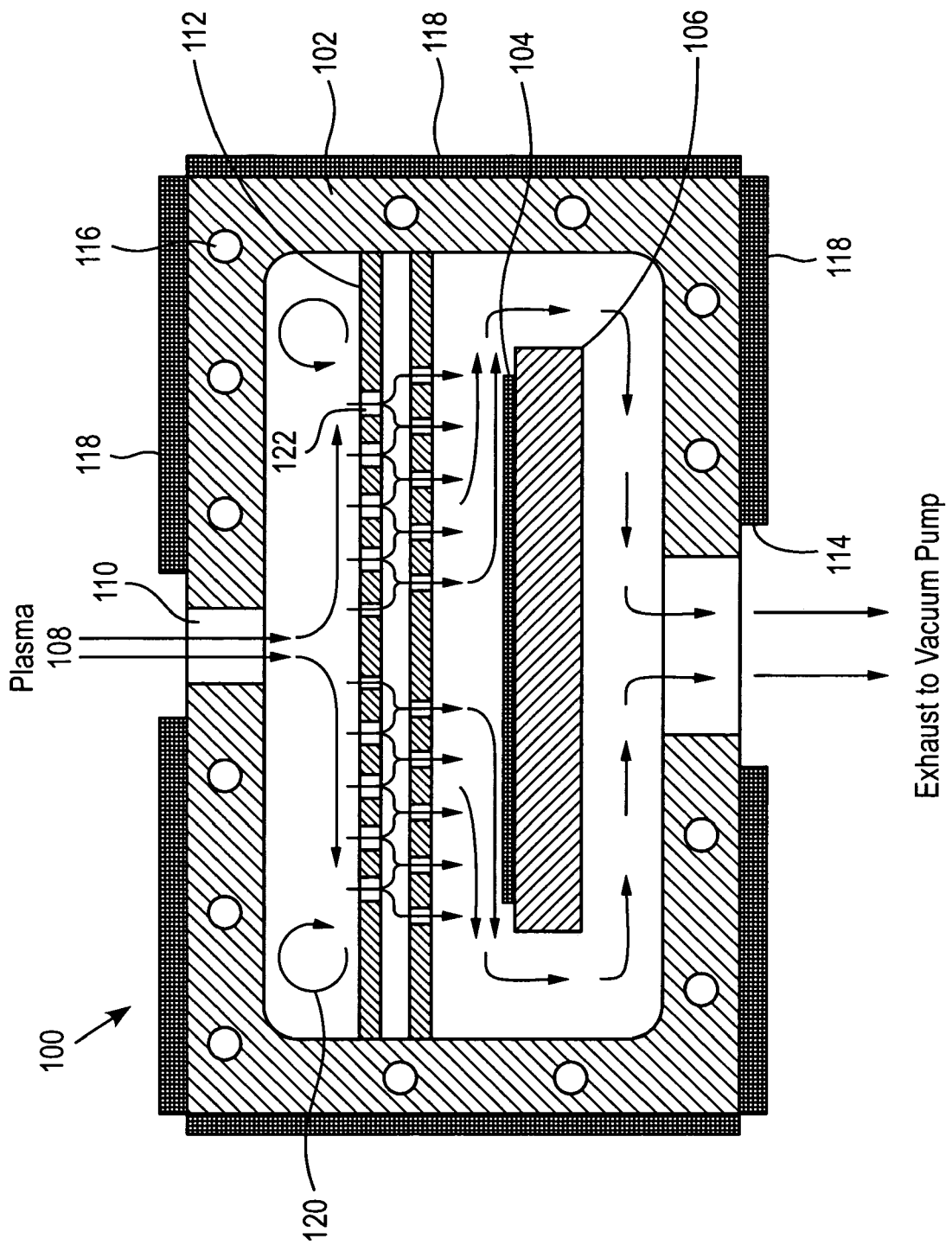
FIG. 1 shows a cross sectional view of a downstream chamber of a photoresist stripper chamber.
Figure 2:
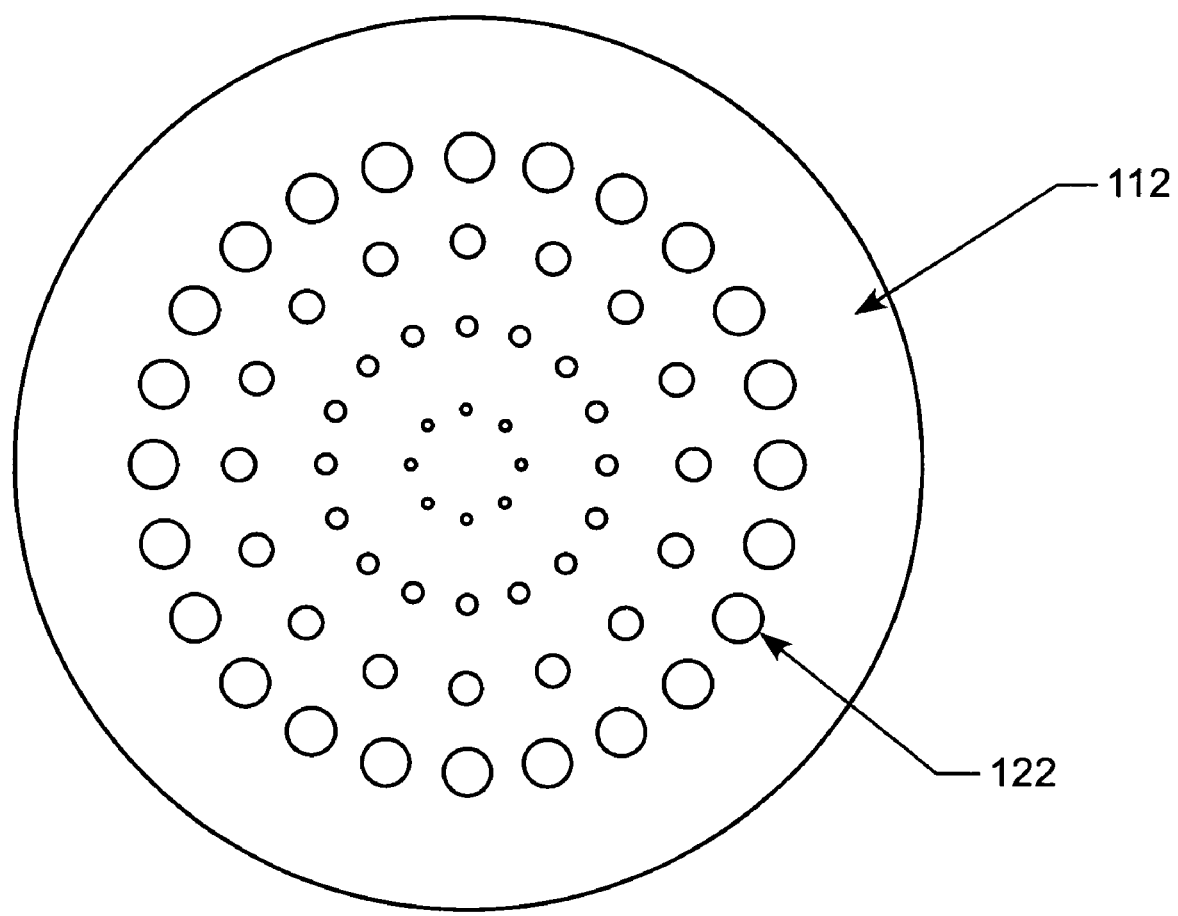
FIG. 2 illustrates a baffle plate of the chamber shown in FIG. 1.

It is noted that the temperature of the gas distribution component 712 may affect the strip rate of the stripper chamber shown at 700. For example, the recombination rate of the gas radicals on the surface of the gas distribution component 712 may vary with the temperature of the surface. In the downstream chamber shown at 100 (FIG. 1), it may be difficult to regulate the temperature of the baffles 112 due to the size of the baffles 112. When the temperature of the baffles 112 varies in time, the process results may differ from substrate to substrate. It may be also difficult to keep each baffle's temperature uniform. For the chamber shown in FIG. 1, the temperature of each baffle 112 may be higher at the center of the baffle since this area is directly under the outlet of the plasma source and receives more heat load than other areas of the baffle. A non-uniform temperature profile may cause the baffle surface to have non-uniform radical recombination efficiency, which further complicates the process. In contrast, the gas distribution component 712 may have a significantly smaller radial dimension than the conventional baffle 112, which may enhance uniformity in the temperature distribution of the gas distribution component 712 along its radial direction and reduce the temperature fluctuation in time.

Figure 8:
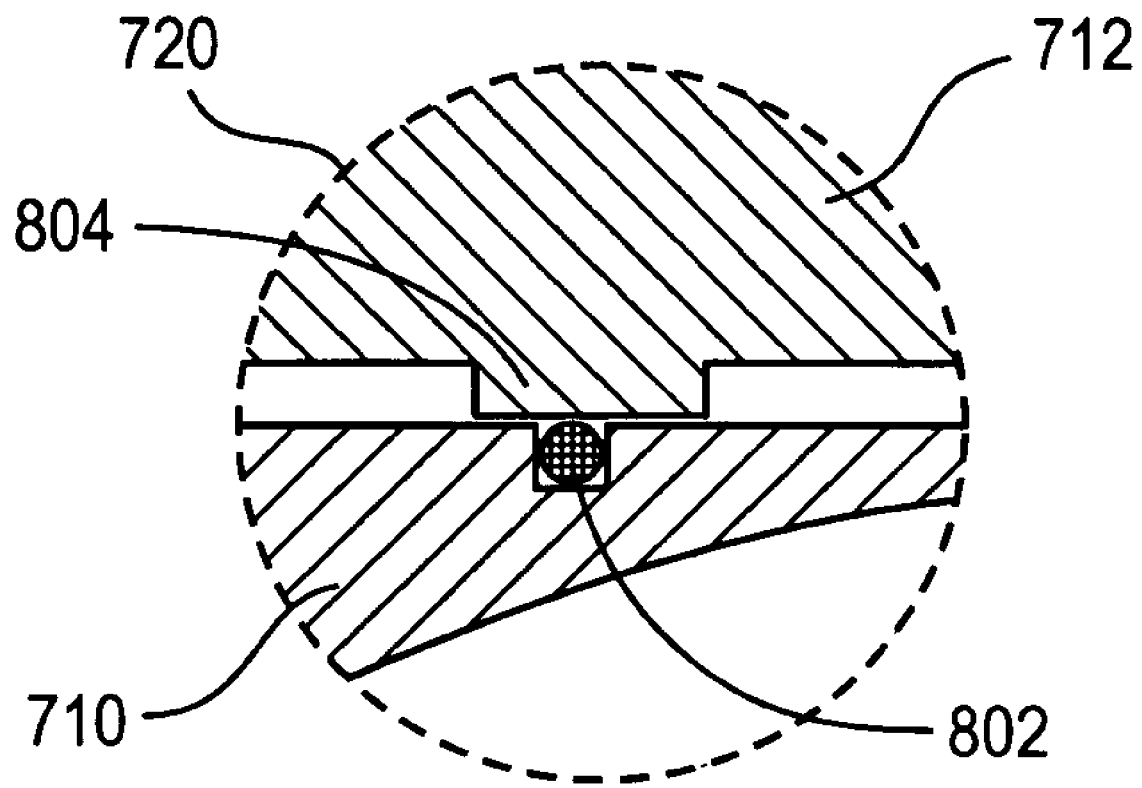
FIG. 8 shows an enlarged diagram of a circled area in FIG. 7.

The internal chamber body 710 may include an upper chamber dome, wherein the top portion of the dome has an opening to receive the bottom step portion or projection of the gas distribution component 712. The gas dispersed by the gas distribution component 712 may be confined by the inner surface of the upper chamber dome for further expansion. The internal chamber body 710 may be in metal-to-metal contact with the gas distribution component 712 at a vacuum sealing area. FIG. 8 shows an enlarged diagram of the circled area 720 (shown in FIG. 7) that contains the vacuum sealing area. As depicted, an O-ring 802 may be disposed between the internal chamber body 710 and a projection 804 formed on the gas distribution component 712. As discussed in conjunction with FIG. 4, the metal-to-metal contact area may be minimized to reduce the formation of metal particles and heat transfer between the gas distribution component 712 and the internal chamber body 708. A gap 723 may be used to reduce heat transfer between the internal chamber body 710 and chamber top 708 as well as the gas distribution component 712.

The internal chamber body 710 may be mounted on the external chamber body 730 at the vacuum sealing area 726. The structural and functional features of the vacuum sealing area 726 may be the same as those of the area 320 in FIG. 3. The internal chamber body 710 may be heated by the one or more heaters 722 coupled to one or more power sources 724. The heater(s) 722 may be rod-shaped cartridge heater(s) or a band heater. The temperature of the internal chamber body 710 may be monitored by one or more temperature sensors 725. The temperature sensor 725 cooperates with a controller such that the power source(s) 724 can be activated in response to temperature sensor readings and thereby provide an automatic temperature control system. As a variation, the power source(s) 724 may permit manual adjustment of the internal chamber body temperature.

As in the case of the stripper chamber shown at 300, the temperature of the external chamber body 730 may be kept below a predetermined level, such as 60° C., for safety reasons, while the temperature of the internal chamber body 710 may reach up to 350° C. To minimize the heat transfer between the inner and outer chamber bodies, a gap 734 may be provided therebetween. Also, the external chamber body 730 may include one or more liquid cooling channels 732 to control its temperature. The internal chamber body 710 may include a curved bottom portion 733 for gradually turning the gas flow direction toward an exhaust port 750 separated by a gap from a similarly shaped portion of the external chamber body 730. The process gas and by products may be drawn through the exhaust port 750 by an exhaust unit 758 coupled thereto. The exhaust unit 758 may include an isolation valve 752 and a throttle valve 754 coupled to a vacuum pump 756.

While the invention has been described in detail with reference to specific embodiments thereof, it will be apparent to those skilled in the art that various changes and modifications can be made, and equivalents employed, without departing from the scope of the appended claims.

What is claimed is:

1. A vacuum chamber comprising:
   a chamber top;
   a gas distribution member and an external chamber body;
   the gas distribution member comprising an internal chamber body configured to be slidably supported on the external chamber body with a gap between outer surfaces of the internal chamber body and inner surfaces of the external chamber body; gas passages extending through a central upper portion of the internal chamber body, the gas passages adapted to direct process gas into the chamber towards the semiconductor substrate; a domed inner surface adapted to overlie the substrate and confine the process gas in a space; and a central upper vacuum sealing surface surrounding the gas passages and adapted to form a vacuum seal with a lower surface of the chamber top;
   the external chamber body having a sidewall and an annular recess in an upper portion of the sidewall, slidably supporting the internal chamber body and configured to surround a side of said internal chamber body with a vacuum gap therebetween;
   an exhaust unit operative to pump the process gas from said chamber;
   the chamber top having a central portion thereof slidably mounted on the central upper portion of said internal chamber body so as to cover a top surface of said internal chamber body with an ambient gap therebetween outward of the central portion and having an opening in fluid communication with said gas passages; and
   a plasma source operative to energize process gas and coupled to said opening for fluid communication with said opening in the chamber top.

2. The chamber as recited in claim 1, wherein at least some of said gas passages are angled to have axes thereof intersect an exposed surface of the substrate.

3. The chamber as recited in claim 1, further comprising one or more heaters supported by the internal chamber body and operable to heat the internal chamber body to a desired temperature.

4. The chamber as recited in claim 1, further including one or more temperature sensors operable to monitor the temperature of said internal chamber body.

5. The chamber as recited in claim 1, wherein said internal chamber body is a metal body which includes a projection which forms metal-to-metal contact and the vacuum seal with the chamber top.

6. The chamber as recited in claim 1, wherein the internal chamber body comprises a main body and an upper plate in which the gas passages are located, the main body including an opening in an upper wall thereof, the upper wall including a vacuum sealing surface surrounding the opening, the upper plate including the central upper vacuum sealing surface surrounding the gas passages, and an O-ring fitted between the vacuum sealing surfaces of the upper plate and the main body so as to form a vacuum seal therebetween.

7. The chamber as recited in claim 1, wherein the gas distribution member comprises a lower vacuum surface surrounding an outer sidewall of the member and adapted to form a vacuum seal with an upper surface on an upper portion of a sidewall of the chamber.

8. The chamber as recited in claim 1, wherein the gas distribution member comprises a top wall, sidewall and bottom wall, the top wall having a thickness which increases towards an outer periphery thereof, the sidewall having a thickness which is greater at an upper portion thereof, and the bottom wall having a central opening therein sized to allow the member to be lowered into the chamber such that a substrate support located at the bottom of the chamber can fit within the central opening.

9. The chamber as recited in claim 1, wherein the gas passages have inlets across a first zone and outlets across a second zone larger in area than the first zone, the second zone extending across an area no more than 50% of the area of the exposed surface of a substrate to be processed in the chamber, the gas outlets being oriented such that inner gas outlets direct process gas toward a central region of the substrate and outer gas outlets direct process gas toward an outer region of the substrate.

10. The chamber as recited in claim 1, wherein said external chamber body includes at least one channel operable to flow cooling fluid therethrough to remove heat from said external chamber body.

11. The chamber as recited in claim 10, further comprising a feedback control system operable to control the flow rate of said cooling fluid through said channel.

12. The chamber as recited in claim 1, further including a temperature adjustment system that is coupled to one or more temperature sensors and provides automatic adjustment of the temperature of said internal chamber body.

13. The chamber of claim 12, wherein the temperature adjustment system maintains the temperature of the internal chamber body in the range of 20 to 50° C., 50 to 100° C., 100 to 150° C., 150 to 200° C., 200 to 250° C., 250 to 300° C. or 300 to 350° C.

14. A method of processing a semiconductor substrate in the chamber of claim 13, wherein the temperature adjustment system maintains the temperature of the internal chamber body in the range of 20 to 50° C., 50 to 100° C., 100 to 150° C., 150 to 200° C., 200 to 250° C., 250 to 300° C. or 300 to 350° C. during plasma processing an exposed surface of the semiconductor substrate.

15. The method of claim 14, wherein the semiconductor substrate is a wafer and the plasma processing comprises stripping a photoresist layer from the wafer.

16. The chamber as recited in claim 1, wherein said internal chamber body is positioned on said external chamber body by a plurality of slots and pins, wherein each of said slots extends along a radial direction of said internal chamber body, is formed in said internal chamber body, and is configured to allow a corresponding pin to slide therealong, and wherein said pins are secured to said external chamber body.

17. The chamber as recited in claim 1, wherein said chamber top includes at least one channel operable to flow cooling fluid therethrough to remove heat energy from said chamber top.

18. The chamber as recited in claim 17, further comprising a feedback control system operable to cooperate with a temperature controlled fluid circulation system which circulates cooling fluid through said channel.

19. A method of processing a semiconductor substrate comprising:
supporting a semiconductor substrate in the vacuum chamber according to claim 1;
generating plasma by use of the plasma source; and
processing the semiconductor substrate with the plasma.

20. The method of claim 19, wherein the semiconductor substrate is a wafer and the processing comprises a step of stripping a photoresist layer on the wafer.

21. The method of claim 19, wherein the semiconductor substrate is a wafer and the processing comprises post-metal etch passivation.

* * * * *